(12) United States Patent
Koo et al.

(10) Patent No.: US 8,122,899 B2
(45) Date of Patent: Feb. 28, 2012

(54) APPARATUS AND METHOD FOR TREATING SUBSTRATE

(75) Inventors: Kyo-Woog Koo, Chungcheongnam-do (KR); Jung Keun Cho, Chungcheongnam-do (KR); Bo Ram Chan Sung, Chungcheongnam (KR)

(73) Assignee: Semes Co., Ltd., Chungcheongnam-do (KR)

( * ) Notice: Subject to any disclaimer, the term of this patent is extended or adjusted under 35 U.S.C. 154(b) by 948 days.

(21) Appl. No.: 11/809,170

(22) Filed: May 31, 2007

(65) Prior Publication Data
US 2008/0014358 A1 Jan. 17, 2008

(30) Foreign Application Priority Data

Jul. 12, 2006 (KR) .................. 10-2006-0065374

(51) Int. Cl.
*B08B 3/12* (2006.01)
*B08B 6/00* (2006.01)

(52) U.S. Cl. .......................... 134/184; 134/2

(58) Field of Classification Search .................. None
See application file for complete search history.

(56) References Cited

U.S. PATENT DOCUMENTS

| | | | |
|---|---|---|---|
| 5,871,584 A * | 2/1999 | Tateyama et al. | 118/323 |
| 6,449,871 B1 * | 9/2002 | Kholodenko et al. | 34/255 |
| 6,928,751 B2 * | 8/2005 | Hosack et al. | 34/594 |
| 2003/0084929 A1 | 5/2003 | Kamikawa et al. | |
| 2005/0233479 A1 | 10/2005 | Chang | |

FOREIGN PATENT DOCUMENTS

| | | |
|---|---|---|
| JP | 06-283494 | 10/1994 |
| JP | 08-017779 | 1/1996 |
| JP | 09-232276 | 9/1997 |
| JP | 9275089 A | 10/1997 |
| JP | 10106999 A * | 4/1998 |
| JP | 11265873 A | 9/1999 |
| JP | 11304361 A | 11/1999 |
| JP | 2001196344 A | 7/2001 |
| JP | 2004254830 A | 9/2004 |
| JP | 2005-317817 A | 11/2005 |
| TW | I 244408 | 11/2002 |
| TW | I 244115 | 9/2004 |

OTHER PUBLICATIONS

Inagaki, Motonori, Apr. 1998, JP 10-106999, English machine translation.*

* cited by examiner

*Primary Examiner* — Michael Barr
*Assistant Examiner* — Jason Ko
(74) *Attorney, Agent, or Firm* — Jenkins, Wilson, Taylor & Hunt P.A.

(57) ABSTRACT

An apparatus is provided for supplying a plurality of chemicals or gases to the surface of a substrate to clean and dry the substrate. The apparatus includes a substrate support unit with a chuck on which a substrate is loaded, a bottom chamber having an open top and configured to surround the circumference of the chuck, a top chamber configured to open or close the top of the bottom chamber such that a drying treatment for the substrate is performed while the substrate is isolated from the outside, and an indirect injection nozzle installed at the edge of the top chamber and configured to inject drying fluid toward the center of the top chamber such that the drying fluid is indirectly injected to the substrate. According to the apparatus, it is possible to enhance a substrate drying efficiency, suppress external contamination, and prevent the formation of an oxide layer.

19 Claims, 6 Drawing Sheets

APPARATUS AND METHOD FOR TREATING SUBSTRATE

CROSS-REFERENCE TO RELATED APPLICATIONS

This U.S. non-provisional patent application claims priority under 35 U.S.C. §119 of Korean Patent Application 2006-65374 filed on Jul. 12, 2006, the entirety of which is hereby incorporated by reference.

BACKGROUND

The present invention relates to substrate treating apparatuses. More specifically, the present invention is directed to a substrate treating apparatus in which chemical or gas is supplied to a top surface of a substrate to clean and dry the substrate and a substrate treating method using the substrate treating apparatus.

In manufacturing semiconductor devices, the arrangement of fine patterns is made by repeatedly depositing and etching an insulating layer and a metallic material, coating and developing photoresist, and removing an asher. Particles generated during these processes are removed by means of a wet cleaning process using deionized water (DI water) or chemical.

Generally a cleaning and drying apparatus includes a wafer chuck provided to hold a wafer. While a wafer held by the wafer chuck is rotated by a motor, DI water or a chemical is supplied to a surface of the wafer. Due to a rotatory power of the wafer, the supplied DI water or chemical spreads out the entire surface of the wafer to perform a cleaning and drying process.

In such a single-wafer cleaning and drying apparatus, a wafer is rinsed using DI water and the rinsed wafer is dried using $N_2$ gas.

However, with the recent trend that a diameter of wafer is larger and pattern of a wafer is finer, DI water may not be fully removed (undried). Since a wafer is cleaned and dried while being exposed to the air, an external environment has a great effect on the wafer to cause poor drying of the wafer.

SUMMARY OF THE INVENTION

Exemplary embodiments of the present invention are directed to a substrate treating apparatus. In an exemplary embodiment, the substrate treating apparatus may include: a substrate support unit with a chuck on which a substrate is loaded; a bottom chamber having an open top and configured to surround the circumference of the chuck; a top chamber configured to open or close the top of the bottom chamber such that a drying treatment for the substrate is performed while the substrate is isolated from the outside; and an indirect injection nozzle installed at the top chamber and configured to inject drying fluid upwardly such that the drying fluid is indirectly injected to the substrate.

A upper space may be formed in the inside of the top chamber. The upper space may include an edge portion with a ring-shape and a central portion extended from the edge portion and the indirect injection nozzle is installed at the edge portion to inject toward the central portion. It is preferable that the central portion is higher than the edge portion. Also, a lower space may be formed below the upper space in the inside of the top chamber, and a protrusive wall may be disposed between the lower space and the edge portion, and a central aperture may be formed between the central portion and the lower space so that drying fluid in the central portion flows to the lower space.

A top surface of the protrusive wall may include a guide surface that is inclined upwardly toward the central portion and a bottom surface of the protrusive wall has a guide surface that is inclined downwardly toward an edge of the substrate.

In another exemplary embodiment, the substrate treating apparatus may include: a substrate support unit with a chuck on which a substrate is loaded; a chamber in which the chuck of the substrate support unit is disposed and provided to define a sealed space such that a drying treatment for the substrate is performed while the substrate is sealed from the outside; and an indirect injection nozzle configured to inject drying fluid upwardly toward the center of the chamber such that the drying fluid is not directly injected to a surface of the substrate.

In still another exemplary embodiment, the substrate treating apparatus may include: a substrate support unit with a chuck on which a substrate is loaded; a bottom chamber having an open top and configured to surround the circumference of the chuck; and a top chamber configured to seal the top of the bottom chamber such that a drying treatment for the substrate is performed in a space sealed from external air.

Exemplary embodiments of the present invention are directed to a substrate treating method. In an exemplary embodiment, the substrate treating method may include: loading a substrate on a chuck disposed inside a bottom chamber; supplying a chemical to the loaded substrate to chemically treat the substrate; and drying the chemically treated substrate, while a top chamber seals the open top of the bottom chamber, using drying fluid indirectly injected from an indirect injection nozzle installed at the top chamber.

DETAILED DESCRIPTION OF PREFERRED EMBODIMENTS

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
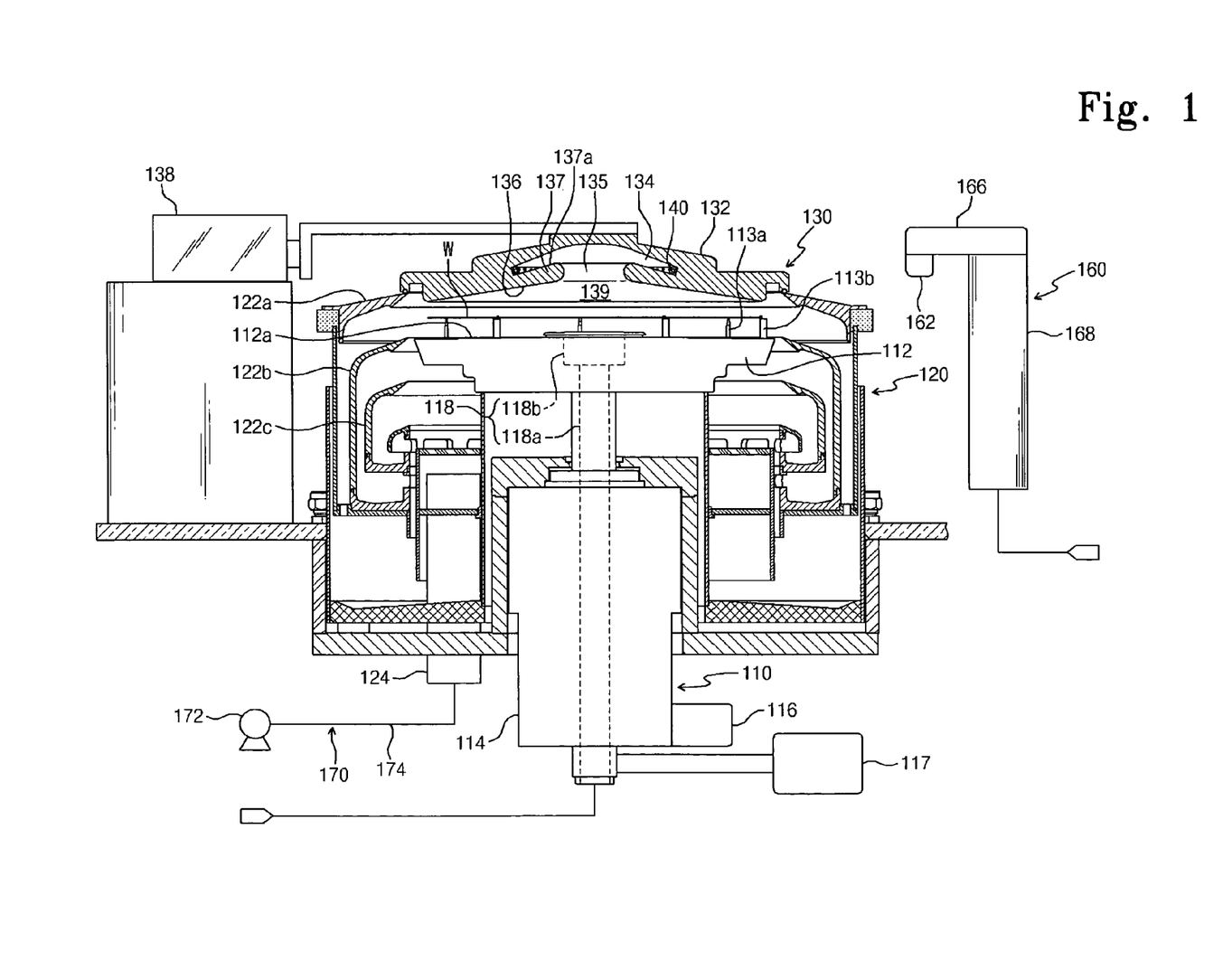
FIG. 1 illustrates a substrate treating apparatus according to the present invention.
Figure 2:
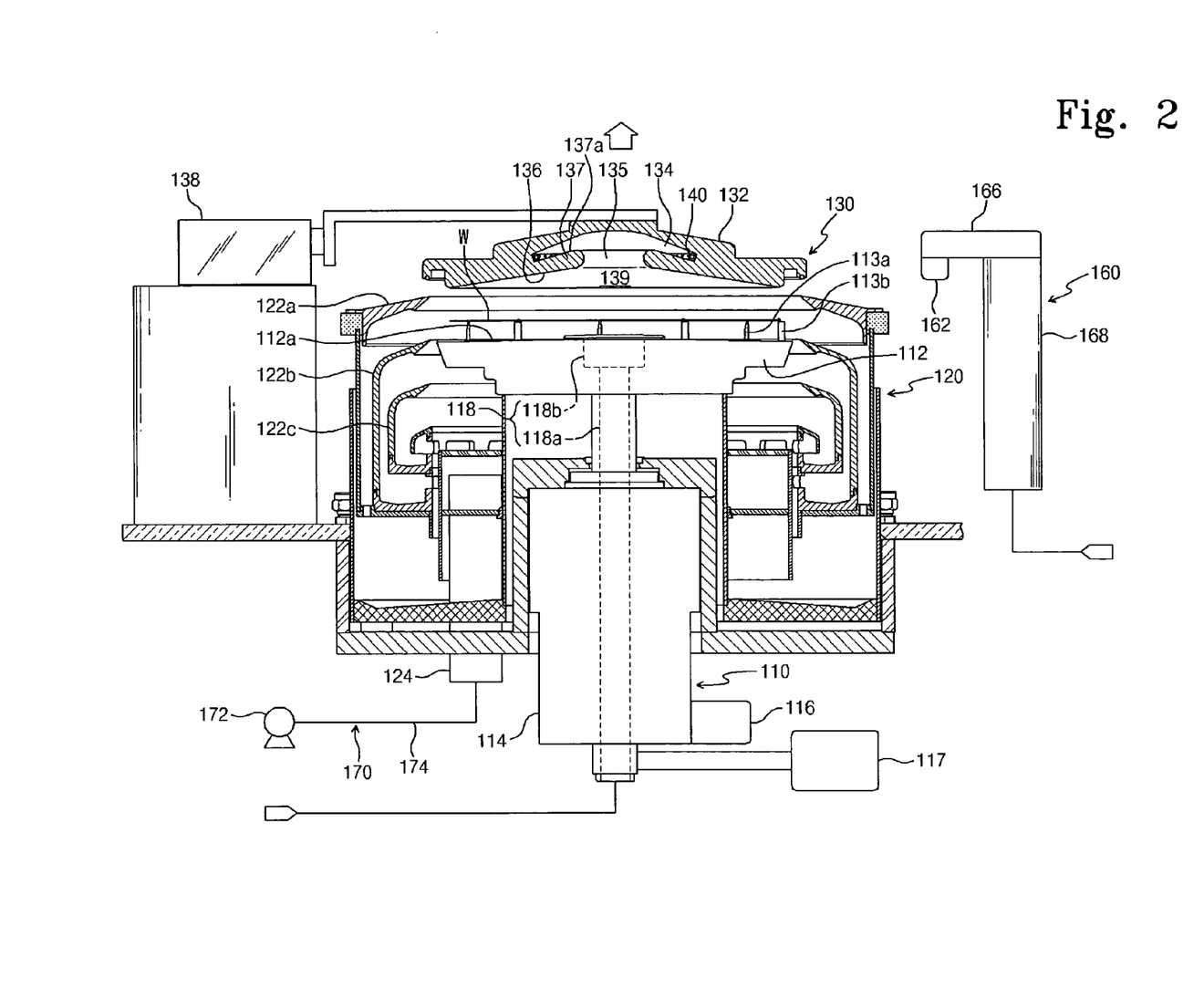
FIG. 2 illustrates a partially open bottom chamber of the substrate treating apparatus illustrated in FIG. 1.
Figure 3:
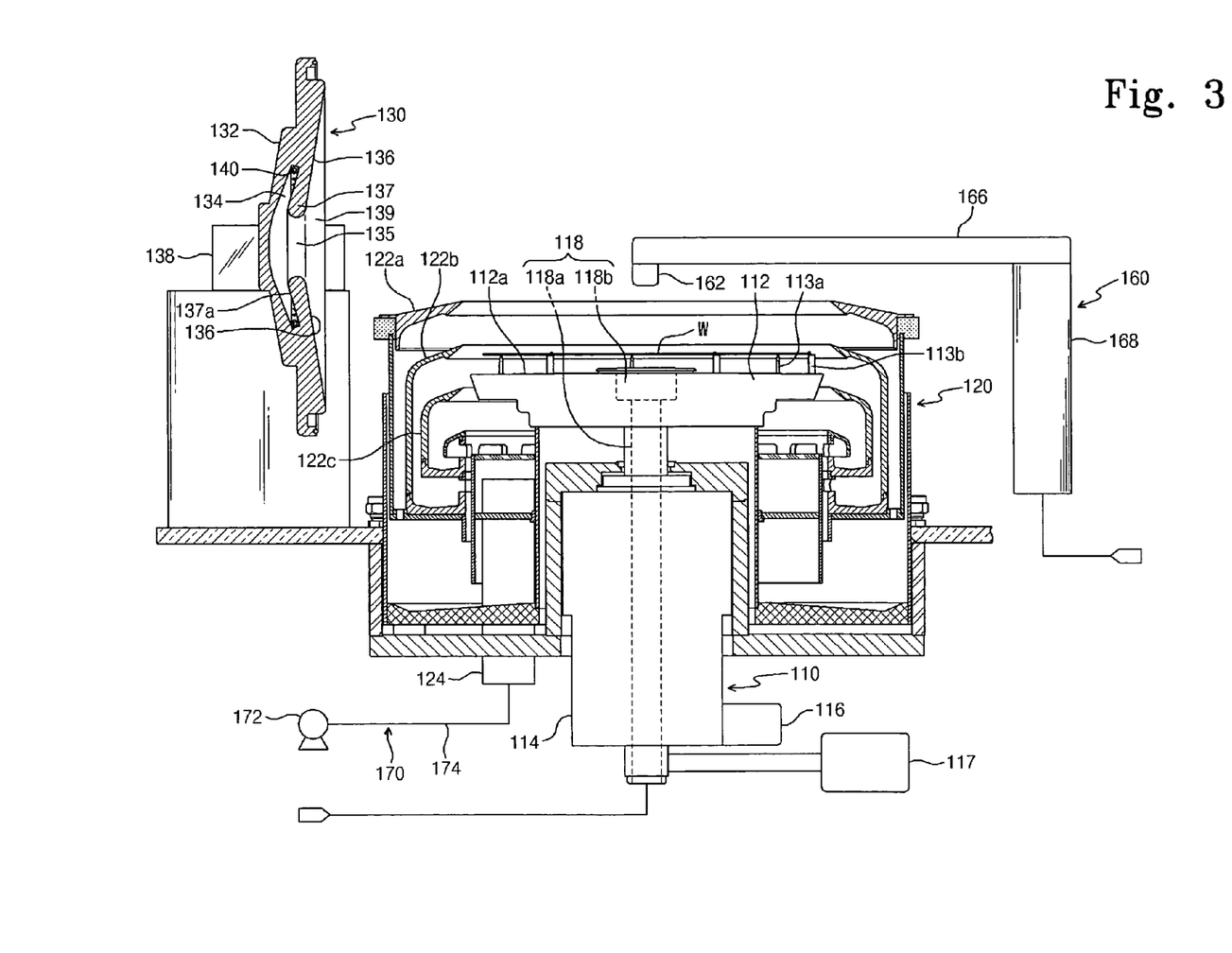
FIG. 3 illustrates a fully open bottom chamber of the substrate treating apparatus illustrated in FIG. 1.

FIG. 1 illustrates a substrate treating apparatus 100 according to the present invention. FIGS. 2 and 3 illustrate a partially open bottom chamber and a fully open bottom chamber of the substrate treating apparatus 100, respectively. The substrate treating apparatus 100 is configured to chemically treat, rinse, and dry a substrate W while spinning the substrate W.

Referring to FIGS. 1-3, the substrate treating apparatus 100 includes a substrate support unit 110, a bottom chamber 120, a top chamber 130, and a chemical nozzle unit 160, and a decompression unit 170.

The substrate support unit 110 is configured to support the substrate W during a process. The substrate support unit 110 includes a chuck 112, spindles 114, a rotating member 116, an elevating member 117, and a back nozzle part 118.

The chuck 112 is disposed at a space inside the bottom chamber 120. The chuck 112 has a top surface 112a on which the substrate W is loaded, support pins 113a to support the substrate W spaced apart from the top surface 112a, and chuck pins 113b provided to fix the substrate W. The substrate W is supported by the support pins 113a while being spaced apart from the top surfaces 112a of the chuck 112. The chucking pins 113b are provided to chuck a portion of the edge of the substrate W during the process.

The spindle 114 is coupled with a central lower portion of the chuck 112. The spindle 114 is provided in the form of a hollow shaft for transferring a rotatory power of the rotating member 116 to the chuck 112. Although not illustrated in detail, the rotating member 116 may include a driving part (e.g., motor) configured to generate a rotatory power, a belt provided to transfer the rotatory power to the spindle 114, and a power transmission part (e.g., chain).

The elevating member 117 is provided to ascend or descend the chuck 112 such that inside the bottom chamber 120, a relative height of the chuck 112 varies with the kind of fluid (or treating process). By means of the elevating member 117, the chuck 112 travels to positions of heights corresponding to first, second, and third suction ducts 122a, 122b, and 122c according to the kind of fluid (or treating process). The ducts 122a, 122b, and 122c will be described in detail later. As described above, the bottom chamber 120 is fixed, and the chuck 112 is ascended or descended according to the cleaning, rinsing, and drying treatments (or the kind of fluid used). However, it is possible that the chuck 112 is fixed and the bottom chamber 120 is ascended or descended.

The back nozzle part 118 is provided for selectively injecting fluid for cleaning and drying treatments to the bottom of the substrate W. The back nozzle part 118 includes a supply pipe 118a and a nozzle 118b. The supply pipe 118a, a flow passage of the fluid, passes a hollow section of the spindle 114, and the nozzle 118b is installed on the center of the top surface of the chuck 112. The nozzle 118b is connected to the supply pipe 118a to be exposed to a central portion of the chuck 112, injecting the fluid for cleaning and drying treatments to a rear surface of the substrate W to clean and dry the rear surface of the substrate W. The supply pipe 118a may be a predetermined pipe or an empty space defined in the form of a pipe inside the spindle 114. Due to the rotation of the substrate W, the fluid injected from the nozzle 118b is easily dispersed to the edge from the center of the rear surface of the substrate W.

The bottom chamber 120 has an open top and is configured to surround the circumference of the chuck 112. The bottom chamber 120 includes first, second, and third ring-shaped ducts 122a, 122b, and 122c which are multi-stepped. These ducts 122a, 122b, and 122c are provided such that the fluid sprayed over the rotating substrate W flows in and is taken in. The bottom chamber 120 includes an exhaust port 124 connected with a vacuum line 174 to forcibly exhaust air. Drain lines (not shown) are connected with the bottom chamber 120 to recover a chemical.

Figure 4:
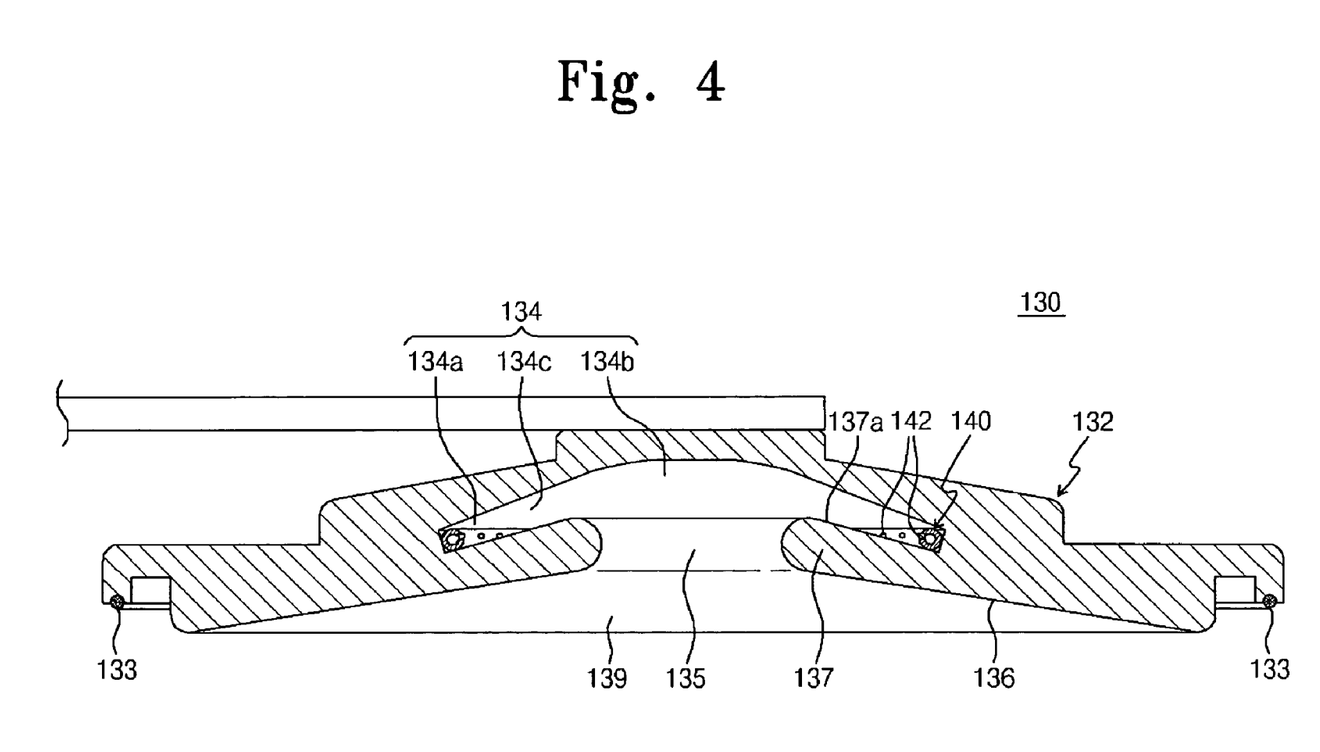
FIG. 4 illustrates a top chamber.
Figure 5:
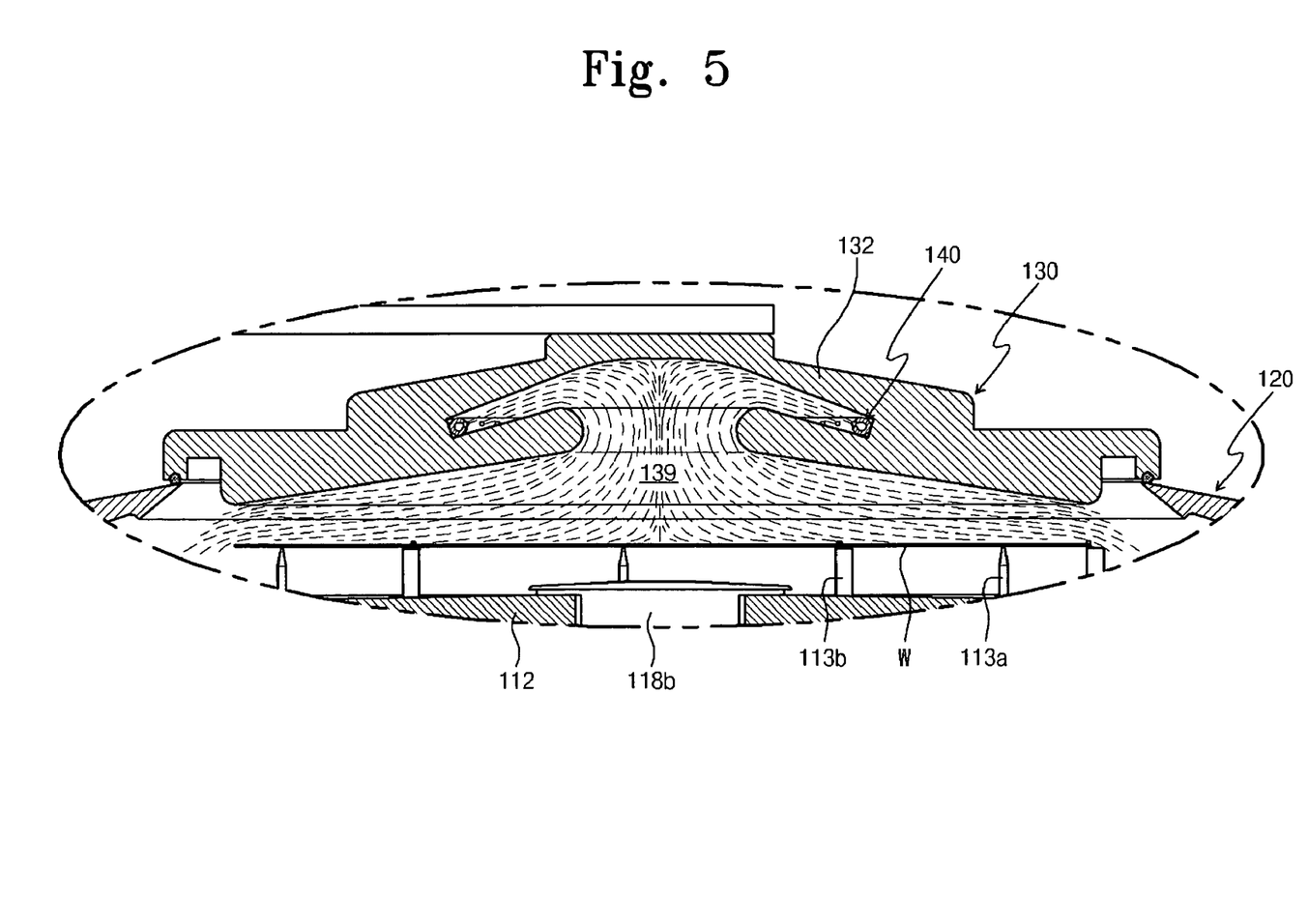
FIG. 5 illustrates the flow of drying fluid injected from first nozzles of the top chamber illustrated in FIG. 4.

Referring to FIGS. 1, 4, and 5, the top chamber 130 includes an upper cup 132, an indirect injection nozzle 140, and a switch driving part 138. The upper cup 132 is provided to open or close the top of the bottom chamber 120. The indirect injection nozzle 140 is installed at the upper cup 132 to indirectly inject drying fluid to the substrate. The switch driving part 138 drives the upper cup 132 to open or close the top of the bottom chamber 120.

The upper cup 132 has a size enough to cover the top of the bottom chamber 120. The upper cup 132 includes a upper space 134, a central aperture 135, a guide surface 136, a protrusive wall 137 and a lower space 139. The upper space 134 is an umbrella-shaped space having an edge portion 134a and a central portion 134b. The edge portion 134a is supplied with a ring shape and the central portion 134b is extended from the edge portion 134a. The indirect injection nozzle is installed on the edge portion 134a. The central portion 134b is supplied to higher position than the edge portion 134a. The upper space 134 has a path 134c inclined to guide the drying fluid, injected from the indirect injection nozzle 140, to its central portion 134b.

The indirect injection nozzle 140 is installed to be arranged as a ring-shape at the edge portion 134a of the upper space 134. The indirect injection nozzle 140 has a plurality of injection holes 142 spaced at regular intervals. The injection holes 142 are formed to inject drying fluid upwardly. The drying fluid flows toward the central portion 134b of the upper space (the center of the upper cup 132) along the upper space 134 after being injected through the injection holes 142 of the indirect injection nozzle 140.

The drying fluid collected at the central portion 134b of the upper space 134 is drained to a lower space 139 through the central aperture 135. The protrusive wall 137 is disposed between the lower space 139 and the edge portion 134a to which the drying fluid injected from the indirect injection nozzle 140 flows. The protrusive wall 137 serves to protect the substrate W from foreign substances dropping from the indirect injection nozzle 140. The central aperture 135 is formed between the central portion 134b and lower space 139. The top surface of the protrusive wall 137 has a guide surface 137a that is inclined upwardly toward the central portion 134b and the bottom surface of upper cup 132 has a guide surface 136 that is inclined downwardly toward an edge of the substrate displaced on the chuck 112.

It is noted that the drying fluid may include organic solvent (IPA) and nitrogen ($N_2$) gas which may be heated at a temperature ranging from 30 to 90 degrees in Celsius.

As described above, the indirect injection nozzle 140 is used to inject drying fluid indirectly to a substrate. Thus, maintain laminar airflow is entirely maintained and a concentration distribution of the drying fluid is more uniformly maintained than using a conventional swing nozzle. Especially, the indirect injection nozzle 140 is disposed at the edge portion (an inwardly dent space) 134a of the upper space 134 to prevent foreign substances dropping from the injection holes 142 of the indirect injection nozzle 140 from dropping onto the substrate.

The guide surface 136 of the upper cup 132 is inclined downwardly from its center to its edge. The drying fluid drained through the central aperture 135 is guided by the guide surface 136 to be gradually diffused from the center to the edge of the substrate. Thus, the guide surface 136 serves to prevent a density of the drying fluid from decreasing at the edge of the substrate. The guide surface 136 of the upper cup 132 is provided to define the lower space 139 which becomes narrow to the edge from the center of the substrate in height.

Since the lower space 139 is reduced to its edge from its center, a density of the drying fluid flowing to the edge from the center of a substrate is higher at the edge of the lower space 139 than at the center thereof. Further, since the drying fluid is gradually diffused to flow from the center to the edge of the substrate, it is uniformly supplied to the entire surface of the substrate.

Especially, since the lower space 139 acting as a flow path of fluid becomes narrower at the edge of the substrate than at the center thereof, the drying fluid flows faster at the edge of the substrate than at the center thereof. Therefore, it is possible to enhance an efficiency of removing particles remaining on the surface of the substrate and an efficiency of drying water.

The top chamber 130 is provided with a sealing member 133 disposed at the side of the upper cup 132 that is in contact with the bottom chamber 120. The sealing member 133 is provided to seal a space in which a substrate is treated.

A decompression unit 170 is provided to decompression a sealed lower space 139 formed by coupling the top and bottom chambers 120 and 130 with each other. The decompression unit 170 includes a vacuum pump 172 and a vacuum line 174 having one end connected to the vacuum pump 172 and the other end connected to the exhaust port 124 of the bottom chamber 120.

As described above, the substrate treating apparatus 100 has the structural characteristics as follows: the lower space 139 of the substrate W is isolated from the outside by the upper chamber 130, and the isolated treatment space (sealed space) "a" may be decompressed to have a pressure lower than the atmospheric pressure. According to the structural characteristics, the effect caused by external environment may be attenuated and a substrate may be dried fast during a substrate drying process.

Although not illustrated in the figures, the bottom chamber 120 and the chuck 112 of the substrate support unit 110 are configured to be elevated relatively or individually. While the bottom chamber 120 and the chuck 112 are ascended or descended, a substrate W may be loaded on the chuck 112 or the treated substrate W may be unloaded from the chuck 112.

Referring to FIGS. 1 and 3, the chemical nozzle unit 160 is configured to inject cleaning fluid and rinsing fluid to a top surface of the substrate W. The chemical nozzle unit 160 includes a nozzle 162 moving upwardly or downwardly in a straight line or moving rotatively to the outside of the bottom chamber 120 from the central top of the substrate W by means of a nozzle moving member 164. The nozzle moving member 164 includes a horizontal support 166 to which the nozzle 162 is coupled and a vertical support 168 connected to the horizontal support 166 and rotatable by means of a motor (not shown).

The number of injection holes and the kind of supplied fluids as well as the space of the injection holes may vary with methods of cleaning and drying a substrate. For example, the fluid for cleaning a substrate may be mixed solution of deionized water (DI water) and hydrofluoric acid (HF), DI water or mixed solution of ammonia solution and hydrogen peroxide-water solution, and the fluid for drying a substrate may be mixed gas of isopropyl alcohol vapor (IPA vapor) and nitrogen gas or nitrogen gas.

As illustrated in FIG. 5, the edge of an upper cup 132 and a substrate is spaced at an interval ranging from 0.5 to 2 centimeters to prevent water particle and drying fluid scattered from the substrate from rebounding against the wall of a bottom chamber.

A substrate cleaning and drying process using the foregoing substrate treating apparatus will now be described below in detail.

Figure 6:
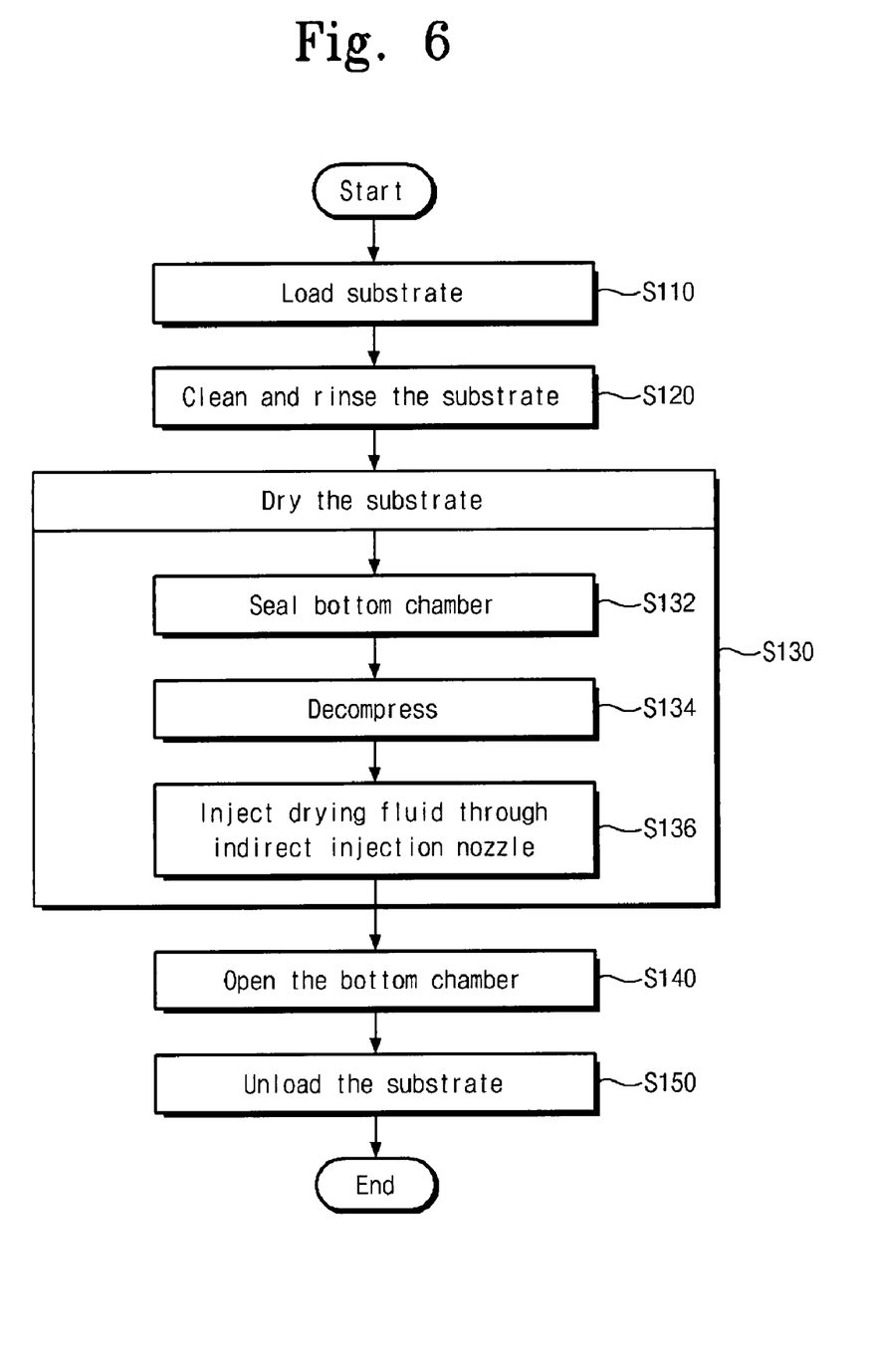
FIG. 6 is a flowchart illustrating a substrate treating method according to the present invention.

FIG. 6 is a flowchart illustrating a substrate treating method according to the present invention.

Referring to FIGS. 1-6, a substrate W is loaded on a chuck 112 through the open top of a bottom chamber 120 (S110). The substrate W is chucked by chucking pins 113$b$ while being supported by support pins 113$a$. The substrate W rotates with the chuck 112 by means of operation of the rotating member 116. The rotating substrate W is cleaned and rinsed by the fluid injected through a nozzle 162 of a chemical nozzle unit 160 (see FIG. 3) (S120).

After the substrate W is cleaned and rinsed, a drying treatment is performed for the substrate W (S130). The drying treatment is performed at a high speed and a pressure lower than atmospheric pressure to prevent generation of watermarks on the surface of the substrate W.

Now, the drying treatment is described in detail. The top of the bottom chamber 120 is sealed by means of an upper cup 132 (S132). A lower space 139 sealed by the top chamber 130 and the bottom chamber 120 is decompressed by means of a decompression unit 170 to have a pressure lower than an atmospheric pressure (S134). When the lower space 139 is decompressed to have a pressure lower than an atmospheric pressure, the substrate W is dried by means of drying fluid indirectly injected through an indirect injection nozzle 140 (S136). The drying fluid may be supplied through the indirect injection nozzle 140 before the decompression of the lower space 139 (from the point when the top chamber 130 travels to seal the bottom chamber 120). The indirect injection nozzle 140 is disposed at the edge portion 134$a$ of a upper space 134 and an injection hole 142 faces upwardly to prevent the substrate contamination caused by foreign substances dropping from the injection hole 142.

The drying fluid is collected to the central portion 134$b$ of the upper space 134 (the top of the upper cup 132) along the upper space 134 after being injected through the injection holes 142 of the indirect injection nozzle 140. The collected drying fluid is drained to the lower space 139 through a central aperture 135. The drained drying fluid flows to dry the surface of the substrate W fast and uniformly while being gradually diffused to the edge from the center of the substrate W.

In the present invention, the top and bottom surfaces of a substrate W may be cleaned and dried at the same time. Cleaning and drying the bottom surface of the substrate W are done by supplying the same fluid as the fluid supplied to the top of the substrate W through a nozzle 118$b$ of a back nozzle part 118 to the bottom surface of the substrate W while rotating the substrate W.

If the drying of the substrate W is ended, the upper cup 132 of the top chamber 130 is elevated to the position illustrated in FIG. 2 before traveling to the position illustrated in FIG. 3 to open the top of the bottom chamber 120 (S140). The substrate W is unloaded from the chuck 112 while being in a stationary position (S150).

The present invention may be applied to all apparatuses for treating a substrate using liquid-phase (or gas-phase) fluid. While a rotary cleaning apparatus has been described in the embodiment of the present invention, the present invention may be applied to a rotary etching apparatus.

To sum up, the present invention has the advantages as follows: (1) a substrate is dried fast; (2) drying fluid is indirectly injected to a substrate to entirely maintain an laminar airflow and uniformly maintain a concentration distribution of the drying fluid; (3) a substrate is protected from external contaminants during a drying treatment; (4) the effect caused by external environment is attenuated during a drying treatment; (5) a substrate is prevented from coming in contact with air; and (6) variation in concentration and temperature of the fluid supplied to dry a substrate is reduced.

Although the present invention has been described in connection with the embodiment of the present invention illustrated in the accompanying drawings, it is not limited thereto. It will be apparent to those skilled in the art that various substitutions, modifications and changes may be made without departing from the scope and spirit of the invention.

What is claimed is:

1. A substrate treating apparatus comprising:
a substrate support unit with a chuck on which a substrate is loaded;
a bottom chamber having an open top and configured to surround the circumference of the chuck;
a removable top chamber disposed over the bottom chamber, the top chamber configured to open or close the top of the bottom chamber such that a drying treatment for the substrate is performed while the substrate is isolated from the outside;
an indirect injection nozzle installed at the top chamber and configured to inject drying fluid upwardly along an inclined first guide surface towards a central portion of the top chamber such that the drying fluid is indirectly injected to the substrate;
wherein the top chamber comprises a second guide surface substantially parallel the first guide surface and inclined for gradually diffusing the drying fluid from a center of the substrate to an edge of the substrate, and the second guide surface at least partially disposed over a portion of the substrate;
wherein the top chamber further comprises an upper space and a lower space, the upper space having an edge portion with a ring-shape and a central portion extending from the edge portion, and the indirect injection nozzle is installed at the edge portion for injecting the drying fluid toward the central portion, and wherein the lower space is formed below the upper space and a protrusive wall is disposed between the upper space and the lower space; and
wherein a central aperture is formed between the central portion of the top chamber and the lower space such that drying fluid in the central portion flows to the lower space, and the central aperture comprises a smaller diameter than a top surface of the chuck.

2. The substrate treating apparatus of claim 1, wherein the central portion is higher than the edge portion.

3. The substrate treating apparatus of claim 1, wherein the first guide surface is inclined upwardly toward the central portion.

4. The substrate treating apparatus of claim 3, wherein the second guide surface is inclined downwardly from the center of the substrate toward the edge of the substrate.

5. The substrate treating apparatus of claim 1, wherein the upper space is formed as an umbrella-shape.

6. The substrate treating apparatus of claim 1, wherein the top chamber is spaced apart from the edge of the substrate at an interval ranging from 0.5 to 2 centimeters to prevent the drying fluid and water particles scattered from the substrate from rebounding against a wall of the bottom chamber.

7. The substrate treating apparatus of claim 1, wherein the bottom chamber includes a plurality of ring-shaped suction ducts arranged in multi-steps to suck air and a chemical scattered over the substrate.

8. The substrate treating apparatus of claim 7, wherein the chuck is ascended or descended according to the heights of the suction ducts.

9. The substrate treating apparatus of claim 1, wherein the chuck comprises support units configured to support an upwardly spaced substrate.

10. The substrate treating apparatus of claim 9, further comprising:
a back nozzle part installed at the chuck to inject cleaning fluid and drying fluid to a rear surface of the substrate.

11. The substrate treating apparatus of claim 1, wherein the drying fluid includes organic solvent or nitrogen gas.

12. The substrate treating apparatus of claim 1, wherein the substrate support unit further comprises chucking pins chucking a portion of the edge of the wafer and the chucking pins being arranged at regular distances as a ring shape, the indirect injection nozzle disposed within the ring shape, when viewed from above.

13. A substrate treating apparatus comprising:
a substrate support unit with a chuck on which a substrate is loaded;
a bottom chamber having an open top and configured to surround the circumference of the chuck; and
a top chamber removably disposed over the bottom chamber and configured to seal the top of the bottom chamber, the top chamber comprising an aperture centrally disposed between an upper space and a lower space of the top chamber, and the aperture having a smaller diameter than each of the upper space, the lower space, a top surface of the chuck, and the substrate, the aperture configured for flowing drying fluid to an inclined lower guide surface at least partially disposed over the substrate;
the upper space formed inside the top chamber for guiding the drying fluid to the central portion of the top chamber when the drying fluid is injected from an indirect injection nozzle, wherein the indirect injection nozzle is disposed at an edge portion of the upper space for injecting the drying fluid upwardly at least partially along an upper guide surface toward the center portion of the top chamber from the edge portion of the upper space;
the lower space disposed below the upper space of the top chamber, the substrate support unit disposed in the lower space during the drying treatment;
a protrusive wall disposed between the upper and lower guide surfaces and the upper space and the lower space, the protrusive wall at least partially disposed over the substrate and extending toward the central portion of the top chamber and having a central aperture connecting the upper space and the lower space.

14. The substrate treating apparatus according to claim 13, wherein:
the indirect injection nozzle disposed in the upper space of the top chamber and configured to inject the drying fluid toward a central portion of the upper space such that the drying fluid is indirectly injected to the substrate.

15. The substrate treating apparatus according to claim 14, wherein the drying fluid is centrally collected in the central portion of the upper space and drains through the aperture into the lower space.

16. The substrate treating apparatus according to claim 15, wherein the lower space comprises a center portion which is extended to a greater height above the substrate than an edge portion.

17. The substrate treating apparatus according to claim 15, wherein the lower space is defined by the lower guide surface extending downwardly from a center portion of the lower space to an edge portion of the lower space to guide the drying fluid drained through the aperture.

18. The substrate treating apparatus according to claim 14, wherein the lower space is configured to have a higher density of the drying fluid at an edge portion of the lower space than at a center portion thereof such that the drying fluid is uniformly supplied to an entire surface of the substrate.

19. The substrate treating apparatus according to claim 13, wherein a drying treatment for the substrate is performed in the lower space sealed from external air.

* * * * *